(12) United States Patent
McMorrow

(10) Patent No.: US 7,719,141 B2
(45) Date of Patent: May 18, 2010

(54) ELECTRONIC SWITCH NETWORK

(75) Inventor: Robert J. McMorrow, Concord, MA (US)

(73) Assignee: Star RF, Inc., Waltham, MA (US)

( * ) Notice: Subject to any disclaimer, the term of this patent is extended or adjusted under 35 U.S.C. 154(b) by 543 days.

(21) Appl. No.: 11/809,203

(22) Filed: May 31, 2007

(65) Prior Publication Data

US 2008/0117894 A1 May 22, 2008

Related U.S. Application Data

(60) Provisional application No. 60/866,147, filed on Nov. 16, 2006, provisional application No. 60/866,144, filed on Nov. 16, 2006, provisional application No. 60/866,139, filed on Nov. 16, 2006.

(51) Int. Cl.
*H01H 47/00* (2006.01)
(52) U.S. Cl. ....................................... 307/115
(58) Field of Classification Search ................. 307/98, 307/112, 125, 115; 455/78, 83
See application file for complete search history.

(56) References Cited

U.S. PATENT DOCUMENTS

| | | | |
|---|---|---|---|
| 4,092,610 A | 5/1978 | White et al. | |
| 4,380,822 A * | 4/1983 | Broton | 455/80 |
| 5,023,566 A | 6/1991 | El-Hamamsy et al. | |
| 5,023,935 A * | 6/1991 | Vancraeynest | 455/80 |
| 5,115,203 A | 5/1992 | Krett et al. | |
| 5,306,986 A | 4/1994 | Siao | |
| 5,479,337 A | 12/1995 | Voigt | |
| 5,612,647 A | 3/1997 | Malec | |
| 5,729,175 A | 3/1998 | Ferrer | |

(Continued)

FOREIGN PATENT DOCUMENTS

EP  1 087 538 A2  3/2001

(Continued)

OTHER PUBLICATIONS

International Search Report and Written Opinion for International Application No. PCT/US2007/023980 mailed Jun. 10, 2008.

(Continued)

*Primary Examiner*—Albert W Paladini
(74) *Attorney, Agent, or Firm*—Wolf, Greenfield & Sacks, P.C.

(57) ABSTRACT

Systems and methods for switching electronic signals are disclosed. The switching may be performed with a low loss and low peak voltages. The switching scheme is suitable for switching RF signals, for example, and may be used in devices such as wireless systems, terminals, and handsets. One exemplary embodiment is directed to a CMOS-implemented transmit/receive switching system. The system comprises one or more transmit ports, each coupled via a respective transmit path to an input/output port and one or more receive ports, each coupled via a respective receive path to the input/output port. Each receive path comprises a switching circuit comprising a transistor and an inductor in parallel with the transistor. The switching circuit is adapted to at least substantially isolate the respective receive port from the input/output port when the transistor is in an on state and operatively couple the respective receive port to the input/output port when the transistor is an off state.

38 Claims, 12 Drawing Sheets

U.S. PATENT DOCUMENTS

| | | | |
|---|---|---|---|
| 5,789,995 A * | 8/1998 | Minasi | 333/103 |
| 5,963,086 A | 10/1999 | Hall | |
| 6,014,055 A | 1/2000 | Chester | |
| 6,127,885 A | 10/2000 | Colangelo | |
| 6,304,137 B1 | 10/2001 | Pullen et al. | |
| 6,404,823 B1 | 6/2002 | Grange et al. | |
| 6,441,673 B1 | 8/2002 | Zhang | |
| 6,459,336 B1 | 10/2002 | Luu | |
| 6,462,620 B1 | 10/2002 | Dupuis et al. | |
| 6,687,380 B1 | 2/2004 | Vishwamitra | |
| 6,701,138 B2 | 3/2004 | Epperson et al. | |
| 6,754,287 B2 | 6/2004 | Underbrink et al. | |
| 6,763,114 B1 | 7/2004 | Nalbant | |
| 6,831,423 B2 | 12/2004 | Chen | |
| 6,856,199 B2 | 2/2005 | Komijani et al. | |
| 6,914,480 B2 | 7/2005 | Arai et al. | |
| 7,092,677 B1 * | 8/2006 | Zhang et al. | 455/78 |
| 7,373,115 B2 * | 5/2008 | Monroe | 455/82 |
| 2003/0058039 A1 | 3/2003 | Noro | |
| 2003/0190895 A1 | 10/2003 | Mostov et al. | |
| 2004/0004517 A1 | 1/2004 | Ruha et al. | |
| 2004/0037363 A1 | 2/2004 | Norsworthy et al. | |
| 2004/0041545 A1 | 3/2004 | Garabandic | |
| 2004/0108900 A1 | 6/2004 | Apel | |
| 2004/0124915 A1 | 7/2004 | Heubi et al. | |
| 2004/0140848 A1 | 7/2004 | Bayko | |
| 2005/0218988 A1 | 10/2005 | Berkhout | |
| 2006/0001332 A1 | 1/2006 | Ollila | |
| 2006/0006934 A1 | 1/2006 | Burns et al. | |
| 2006/0006937 A1 | 1/2006 | Burns et al. | |
| 2006/0006939 A1 | 1/2006 | Burns et al. | |
| 2006/0170043 A1 | 8/2006 | Liu et al. | |

FOREIGN PATENT DOCUMENTS

| | | |
|---|---|---|
| WO | WO 03/041249 A1 | 5/2003 |
| WO | WO 2005/025065 A1 | 3/2005 |

OTHER PUBLICATIONS

A. Alipov and V. Kozyrev, "Push/Pull Class-DE Switching Power Amplifier", 2002 IEEE MTT-S International Microwave Symposium Digest, (IMS 2002), Seattle, WA, June 2-7, 2002, IEEE MTT-S International Microwave Symposium, New York, NY, IEEE, US, Jun. 2, 2002, pp. 1635-1638, vol. 3 of 3.

S. Hintea, E. Simion and L. Festila, "Radio Frequency Link Used in Partially-Implanted Auditory Prosthesis", Electronics, Circuits and Systems, 1996, ICECS '96, Proceedings of the Third IEEE International Conference on Rodos, Greece, Oct. 13-16, 1996, New York, NY, USA, IEEE, US, pp. 1143-1146, vol. 2.

* cited by examiner

ELECTRONIC SWITCH NETWORK

RELATED APPLICATIONS

This application claims priority under 35 U.S.C. §119(e) to U.S. Provisional Application Ser. No. 60/866,147, entitled "Electronic Switch Network," filed on Nov. 16, 2006; U.S. Provisional Application Ser. No. 60/866,144, entitled "Distributed Multi-Stage Amplifier," filed on Nov. 16, 2006; and U.S. Provisional Application Ser. No. 60/866,139, entitled "Pulse Amplifier," filed on Nov. 16, 2006. Each of the foregoing applications is hereby incorporated by reference herein in its entirety.

FIELD OF INVENTION

This invention relates to the field of electronic and RF switching. Applications include, but are not limited to, wireless systems, microwave components, transceivers, CMOS amplifiers, and portable electronics.

BACKGROUND OF INVENTION

Switches in analog and radiofrequency (RF) applications often must deal with a wide dynamic range of signal strength. Transmitters, in particular, sometimes have to handle very high peak voltages. This can be a problem in the field of switch design, as the signal strength may exceed the voltage breakdown of the device. Another problem is that the control voltages available are much smaller than the signal strength. This makes it difficult to keep the switches in an on or off position. Switches for wireless handsets are a notable example of a system exhibiting these problems. In a GSM handset, for instance, the maximum signal strength may be as high as 35 dBm. Transmission through a 50 Ohm system results in a peak voltage of 17.88 V, while the control voltage and maximum available supply voltage are 2.5 V and 3.5 V, respectively.

FIG. 1 demonstrates one of the oldest circuits used to deal with this problem. In this case discrete PIN diodes are used as the switching element. This type of diode exhibits excellent RF characteristics with a large breakdown voltage. Direct current (DC) voltages are used to forward or reverse bias the diodes for a low or high impedance. A quarter wave matching network is required to isolate the off port from the on port. This solution works well in multi-port systems. However, high performance PIN diodes are not easily integrated. Further, a large number of passive elements are required to provide the bias and matching. Another significant problem is the current necessary to forward bias the diodes. This may be acceptable in a simple transmit-receive system, as the design may be configured so that the on diode is only used in the transmit mode. Multi-port systems, however, require current in receive mode as well.

Another common solution is shown in FIG. 2. In this case, field effect transistors (FETs) are used for the switching elements. Gallium arsenide (GaAs) pseudomorphic high electron mobility transistors (PHEMTs) are most commonly used due to their low loss and high breakdown voltage. However, the breakdown voltage is only about 16 V, which is too low to handle high signal level of a GSM system by itself. Also, a control voltage of 2.5 V will result in the off transistor turning on during the negative swing of the output signal. The solution to these problems is to use multiple FETs in series, as shown in FIG. 3. This effectively divides the signal voltage evenly across each transistor. This solution is capable of handling the high signal levels while introducing an acceptable amount of loss. It also has the advantage of a near zero current requirement, may be configured for multiple ports applications, and may be integrated on a single die. A disadvantage is that a large number of control signals are required. The lack of a complementary transistor technology on GaAs means that any logic functions will draw significant amounts of current. A separate CMOS control chip is often used with the GaAs switch die for this reason. Also, the use of an exotic technology means that the switch cannot be integrated with the other functions in the handset.

Attempts have been made to use CMOS as a switching technology with limited success. In some cases, a DC converter has been used to overcome the control signal limitations. However, the high loss of the substrate has been unacceptable. Silicon-on-Sapphire (SOS) and other exotic technologies have overcome this problem, but the high cost makes then unsuitable for integration with other functions.

SUMMARY OF INVENTION

One embodiment of the invention is directed to a switching system operable in a transmit mode and a receive mode. The switching system comprises a transmit port coupled via a transmit path to an input/output port; a receive port coupled via a receive path to the input/output port; and a switching circuit in the receive path. The switching circuit comprises a switch device comprising an input terminal, an output terminal, and a control terminal to receive a control signal that controls a state of the switch device between an on state and an off state. When the switch device is in the on state, the switching system is adapted to operate in a transmit mode in which the transmit port is operatively coupled to the input/output port and the receive port is at least substantially isolated from the input/output port. When the switch device is in the off state, the switching system is adapted to operate in a receive mode in which the receive port is operatively coupled to the input/output port.

Another embodiment of the invention is directed to a CMOS-implemented switching system comprising one or more transmit ports, each coupled via a respective transmit path to an input/output port and one or more receive ports, each coupled via a respective receive path to the input/output port. Each receive path comprises a switching circuit comprising a transistor and an inductor in parallel with the transistor. The switching circuit is adapted to at least substantially isolate the respective receive port from the input/output port when the transistor is in an on state and operatively couple the respective receive port to the input/output port when the transistor is an off state.

A further embodiment of the invention is directed to transmit/receive device comprising an antenna; a radio-frequency transmitter; a radio-frequency receiver; and a switching system. The switching system comprises a transmit port arranged between the transmitter and the antenna, wherein the transmit port is coupled to the antenna via a transmit path; a receive port arranged between the receiver and the antenna, wherein the receive port is coupled to the antenna via a receive path; and a switching circuit in the receive path. The switching circuit comprises a switch device comprising an input terminal, an output terminal, and a control terminal to receive a control signal that controls a state of the switch device between an on state and an off state. When the switch device is in the on state, the switching system is adapted to operate in a transmit mode in which the transmit port is operatively coupled to the input/output port and the receive port is at least substantially isolated from the input/output port. When the switch device is in the off state, the switching system is adapted to operate in a receive mode in which the receive port is operatively coupled to the input/output port.

Another embodiment of the invention is directed to a switching method, comprising an act of using CMOS switching circuitry, switching a transmit/receive device between a transmit mode, in which a transmission signal comprising a transmission carrier signal is transmitted from a transmit port to an input/output port, and a receive mode, in which a reception carrier signal is transmitted from the input/output port to a receive port. When operated in the transmit mode, the CMOS switching circuitry generates no harmonics larger than approximately −60 dB relative to the transmission carrier signal. When operated in the transmit mode, the CMOS switching circuitry imposes a signal loss on the transmission signal that is no greater than about 2.5 dB.

A further embodiment of the invention is directed to a switching system, comprising CMOS switching circuitry adapted to switch between a transmit mode, in which a transmission signal comprising a transmission carrier signal is transmitted from a transmit port to an input/output port, and a receive mode, in which a reception carrier signal is transmitted from the input/output port to a receive port. The CMOS switching circuitry is adapted to generate no harmonics larger than approximately −60 dB relative to the transmission carrier signal when operated in the transmit mode. The CMOS switching circuitry is also adapted to impose a signal loss on the transmission signal that is no greater than about 2.5 dB when operated in the transmit mode.

Another embodiment of the invention is directed to a switching system operable in a transmit mode and a receive mode. The switching system comprises a plurality of ports comprising at least one transmit port coupled to an input/output port and at least one receive port coupled the input/output port; and switching circuitry adapted to select one of the plurality of ports to be operatively coupled the input/output port, wherein a transmit port is operatively coupled to the input/output port when the switching system is operated a transmit mode, and wherein a receive port is coupled to the input/output port when the switching system is operated in a transmit mode. The switching circuitry comprises at least one transistor, and wherein each transistor of the switching circuitry is in an on state when the switching system is operated in the transmit mode.

A further embodiment of the invention is directed to a switching system operable in a first mode and a second mode. The switching system comprises a first port coupled via a first path to an input/output port, wherein the first port passes a first signal; a second port coupled via a second path to the input/output port, wherein the second port passes a second signal having a lower power than the first signal; and a switching circuit in the second path, the switching circuit comprising a switch device comprising an input terminal, an output terminal, and a control terminal to second a control signal that controls a state of the switch device. The switching circuit is adapted to switch the switching system between (1) a first mode in which the voltage across the switch device is substantially zero, the first port is operatively coupled to the input/output port, and the second port is at least substantially isolated from the input/output port, and (2) a second mode in which the second port is operatively coupled to the input/output port.

Another embodiment of the invention is directed to a switching system comprising one or more first ports, each coupled via a respective first path to an input/output port, wherein each first port passes a respective first signal; and one or more second ports, each coupled via a respective second path to the input/output port, wherein each second port passes a respective second signal having a lower power than each first signal. Each second path comprises a switching circuit comprising a transistor and a transformer in parallel with the transistor, and the switching circuit is adapted to switch the switching system between (1) a first mode in which the voltage across the transistor is substantially zero, the first port is operatively coupled to the input/output port, and the second port is at least substantially isolated from the input/output port, and (2) a second mode in which the second port is operatively coupled to the input/output port.

DETAILED DESCRIPTION

Figure 1:
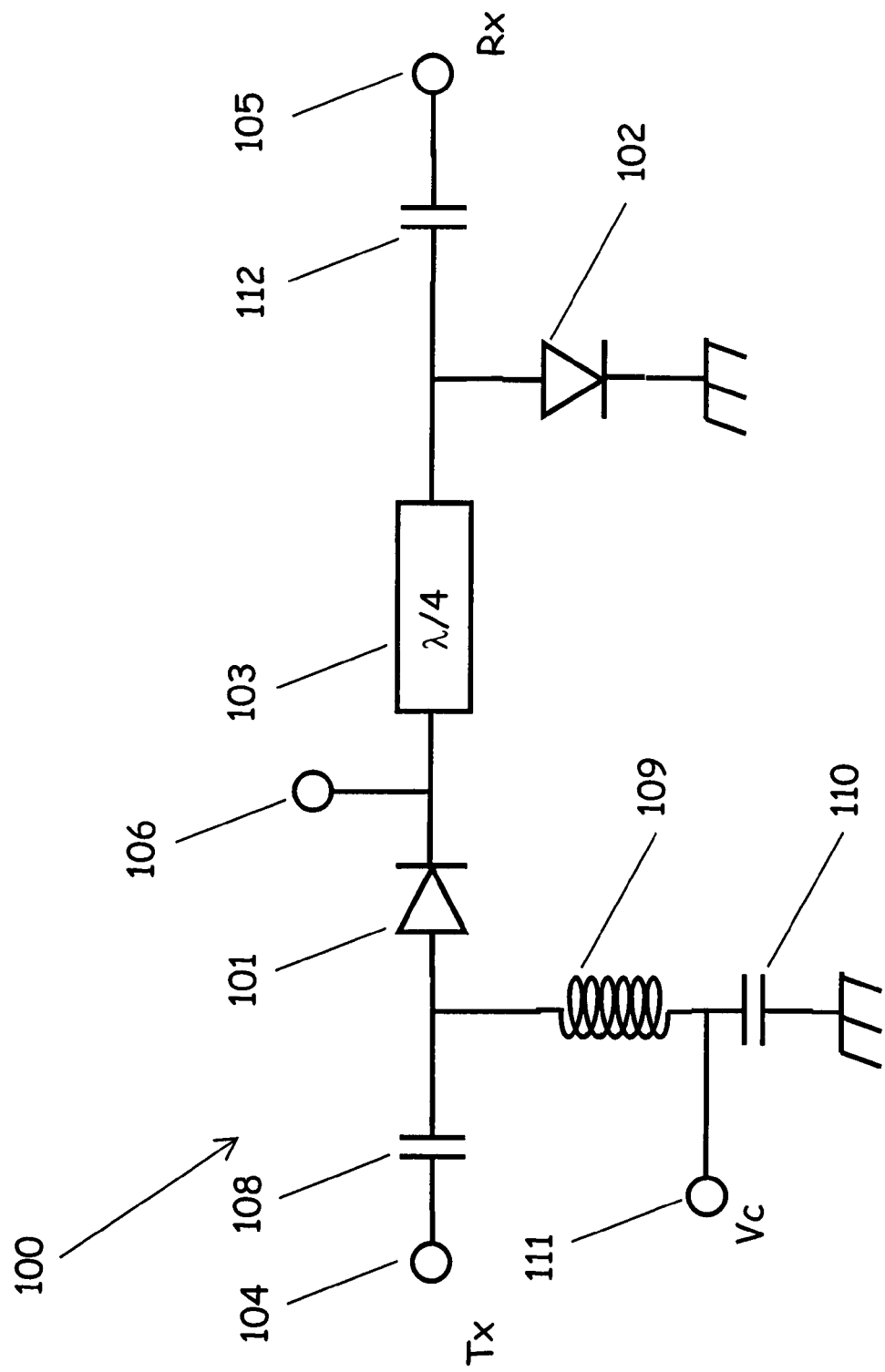
FIG. 1 shows a conventional switch implemented using PIN diodes.

FIG. 1 shows how PIN diodes have conventionally been used to switch RF signals. A switch 100 comprises a transmit port 104 and a receive port 105, each coupled to an antenna 106. The transmit path comprises a capacitor 108 and a diode 101, an inductor 109 coupled between the capacitor 108 and the diode 101, and a capacitor 110 coupled between the inductor 109 and ground. A control signal Vc is applied to a node 111 between the inductor 109 and the capacitor. The receive path comprises a quarter wave line 103, a capacitor 112, and a diode 102 coupled at one end between the quarter wave line 103 the capacitor 112. At its other end, the diode 102 is coupled to ground.

In transmit mode, the control signal Vc is set high, which forward biases both diodes 101 and 102. When diode 101 is forward biased, it presents a low impedance path from the transmit port 104 to the receive port 105. When the diode 102 is forward biased, it presents a near short circuit to the receive port 105, which helps to isolate it from the high transmit signal levels. The quarter wave line 103 transforms the short circuit impedance at the receive port 105 to a high, new open, impedance at the antenna 106. When Vc is set low, both diodes 101 and 102 are reversed biased and in a high impedance state. Diode 101 provides a high impedance path and isolates the transmit and antenna ports 104, 106. Diode 102 is also in a high impedance state, which allows signals to flow freely between the receive and antenna ports 105, 106.

Figure 2:
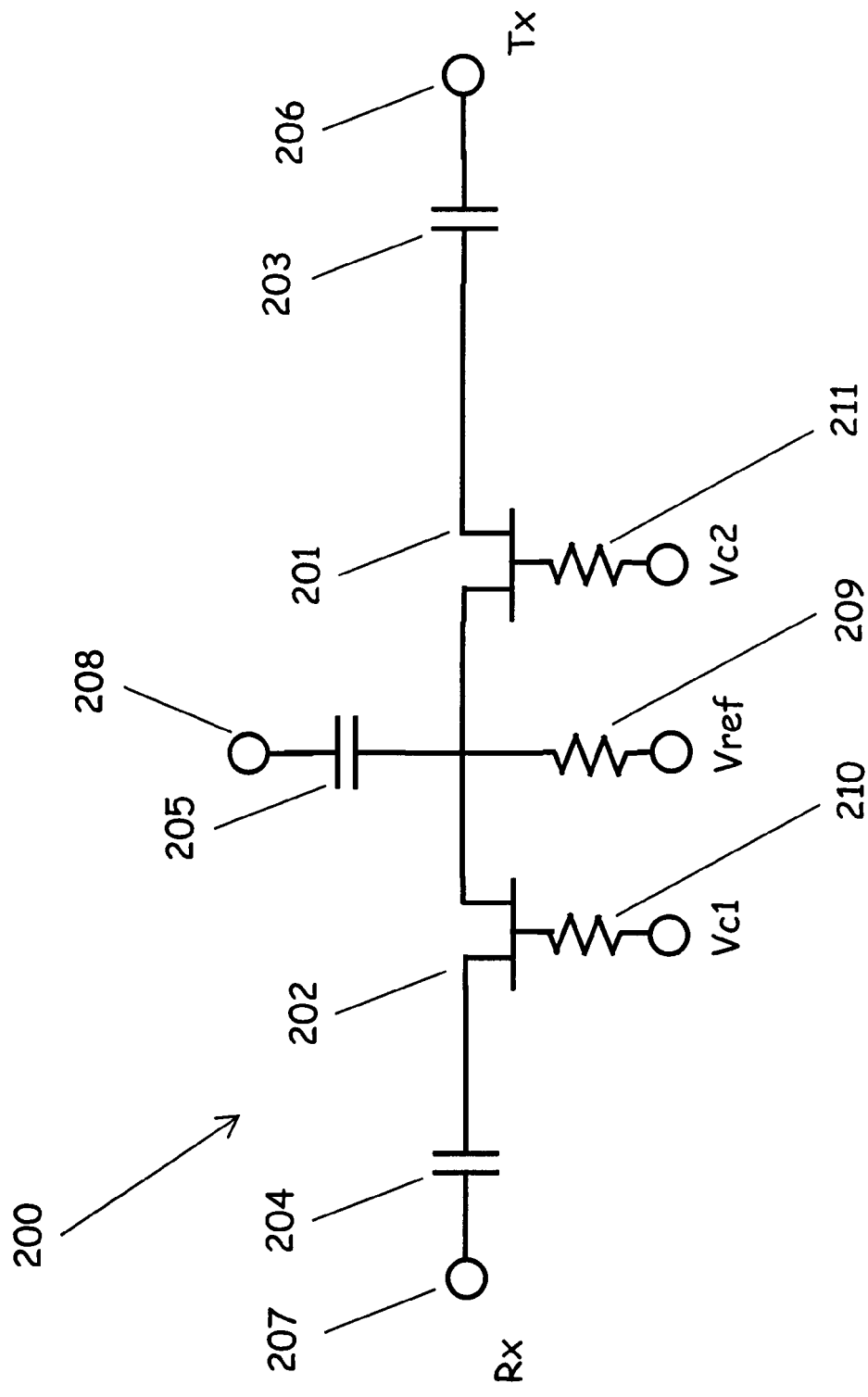
FIG. 2 shows a first conventional switch implemented FET switches.

FIG. 2 shows a common implementation of an Single-Pull-Double-Throw (SPDT) switch 200 implemented using field effect transistors (FETs) 201 and 202. GaAs PHEMTs are most commonly used for this application. Because these are depletion mode devices, the gate must be biased below the drain and source terminals to turn the transistor off. To accommodate this, the switch is typically DC isolated or "floating" via the use of blocking capacitors 203, 204, 205 at the respective transmit, receive and antenna ports 206, 207, 208. A control signal Vref, which is applied to one end of a resistor 209, is then set to the highest control voltage. A control signal equal to Vref may thus turn the switch on and a control signal of zero may turn the switch off. When complementary signals are used for control signals Vc1 and Vc2, which are respectively coupled to FETs 202 and 201 via resistors 210 and 211, FETs 101 and 102 are toggled and the switch moves between transmit mode and receive mode.

Figure 3:
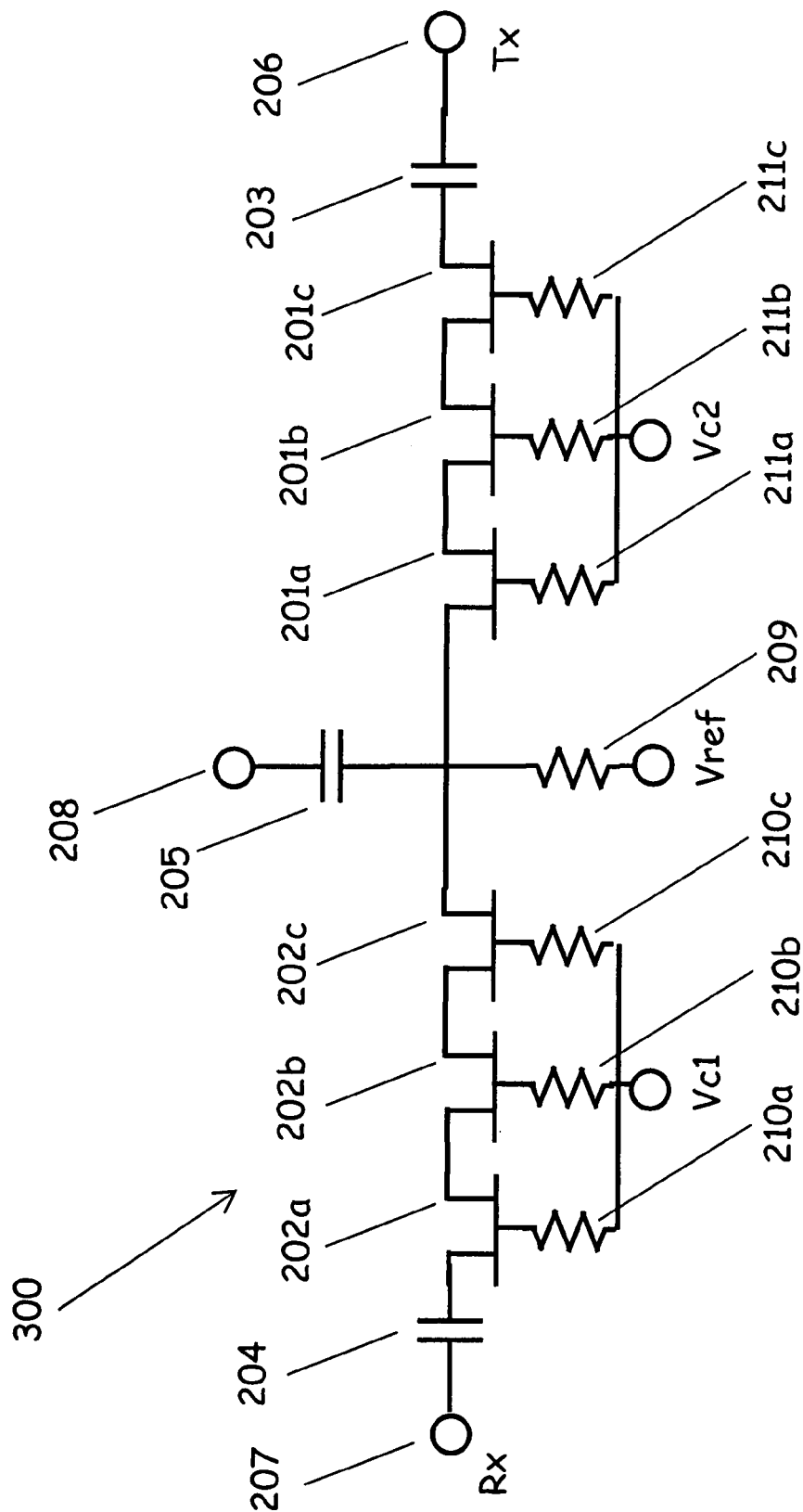
FIG. 3 shows a second conventional switch implemented FET switches.

FIG. 3 shows a switch 300 similar to the SPDT switch of FIG. 2, wherein FETs 201 and 202 have each been replaced with three series FETs 201a-c and 202a-c. The control signals Vc2 and Vc1 are used to control the respective chains of FETs 201 and 202. The advantage of this technique is that the voltage is divided across the off chain, avoiding breakdown.

Single-Pole-Multi-Throw switch topologies share a common problem for transmit/receive systems. This is partly due to the reciprocal nature of the design. During transmit, one branch of the switch is on while multiple receive branches are turned off. The switch should have low loss in the transmit branch while providing adequate isolation to the receive ports to protect the low noise amplifiers (LNAs) coupled to them. However, the opposite case is not true. In receive mode, the loss is important, but the isolation from the transmit port is only important insofar as it impacts the loss. The receive signal strength will not cause any damage to the power amplifier coupled to the transmit port. Single-Pole-Multi-Throw switch topologies tend to provide similar isolation for both cases. Certain exemplary embodiments disclosed herein may make use of these uneven or non-reciprocal requirements.

Another aspect of switches for transmit/receive systems is that the most distortion and potential damage to the devices occurs because a switching transistor is held in the off position, with a high impedance, while the switch is handling the highest signal levels. When the transistors are in a high impedance state, all of the signal potential may be present across the terminals of the device. This increases the risk of entering the transistor breakdown region. The existence of both a positive and negative voltage swing makes it difficult to keep the transistor fully off, causing some channel modulation and signal distortion. Such high voltage potentials, with risk of breakdown and control problems, are usually not be present in the devices in the on position. These devices may be in a low impedance state. Instead they may have to pass large currents. If the devices are scaled so as to operate in the linear region, the voltage potential can remain low, avoiding breakdown and signal distortion, and the devices may remain in the on state. In certain exemplary embodiments disclosed herein, a switch may be configured so that all transistors remain in an on state during transmit mode.

Figure 4:
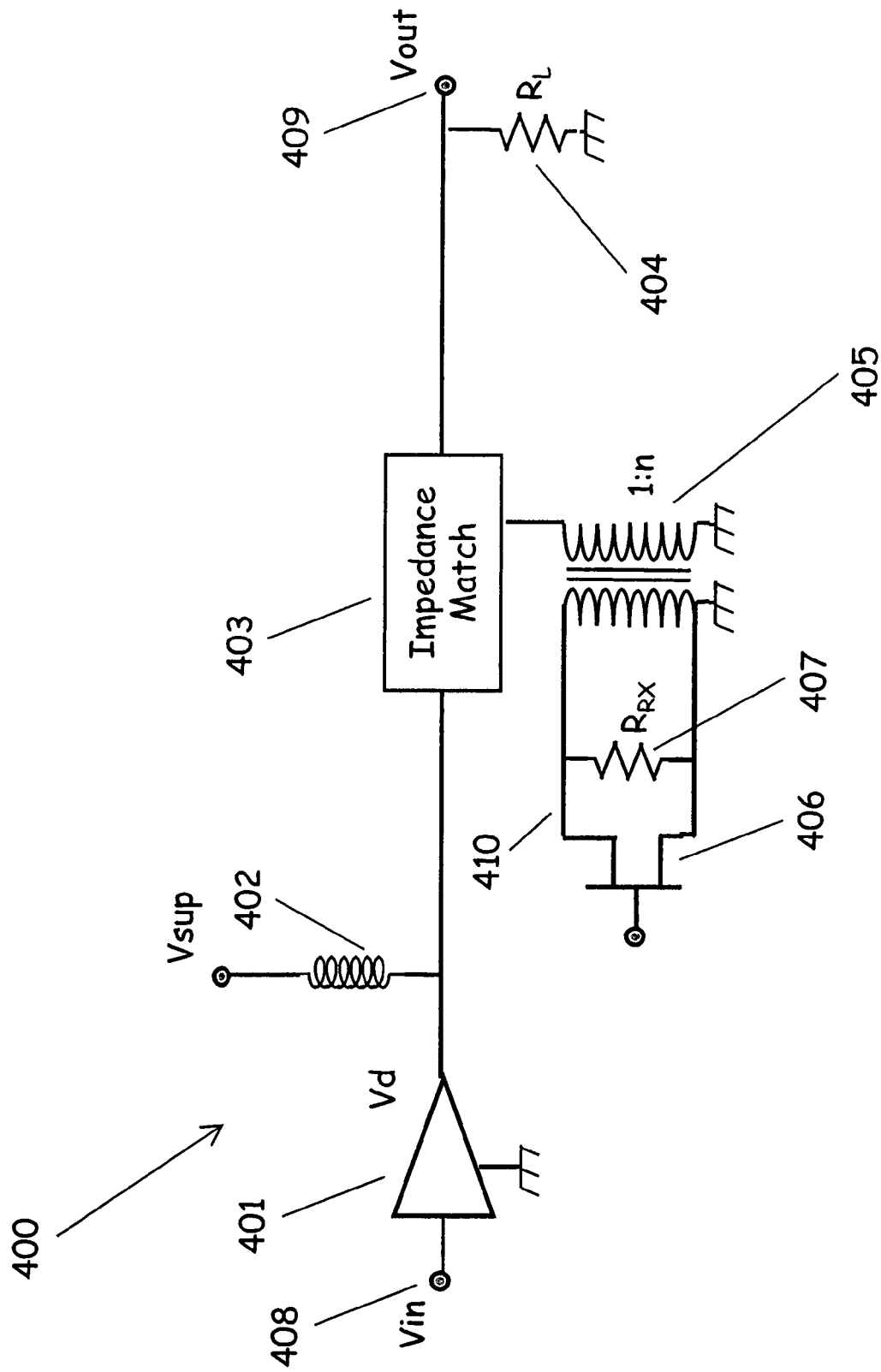
FIG. 4 shows a first embodiment of a switching system that performs a Single-Pull-Double-Throw (SPDT) function.

FIG. 4 shows one embodiment of a switching system that makes use of the aforementioned uneven or non-reciprocal requirements, and which may be configured such that all transistors remain in an on state during transmit mode. Transmit/Receive switching system 400 comprises a transmit path including a transmit port 408, which is coupled via a power amplifier 401 and an impedance matching network 403, to an output port 409. The output port 409 is coupled to load impedance 404. The switching system 400 also comprises a receive path. In the receive path, a receive impedance 407, switching transistor 406 and transformer 405 are coupled in parallel with each other and between a receive port 410 and the impedance matching network 403. An inductor 402, coupled between the power amplifier 401 and the impedance matching network 403 is used to bias the power amplifier 401. Transformer 405 is coupled to a shunt element of the impedance matching network 403. The shunt element may have a wide variety of configurations, including one or more resistors, capacitors, and inductors, alone or in combination. In this embodiment, the shunt element may be advantageously selected to be the element that would be used in a transmitter without the receiving path, and coupled from the impedance matching network to ground, so as to provide the correct matching impedance to the power amplifier.

In transmit mode, the power amplifier 401 may be turned on, and amplifies a signal Vin to a level Vd. Signal Vd then propagates through the matching network 403. Switching device 406 is turned on and provides a low impedance from the receive port to ground. This may effectively short out the two primary terminals of the transformer 405. The transformer may map the impedance seen at the primary winding to the secondary winding by the equation $Zs=n*Zp$. When the primary impedance approaches a short circuit, the secondary impedance may also approach a short circuit. This may effectively couple the shunt element in the impedance matching network to ground. The shunt element may then have the proper impedance to match the power amplifier 401 to the load impedance 404. For example, the shunt element may be designed such that when coupled to ground as previously described, the shunt element has an impedance to suitable to match the power amplifier 401 to the load impedance 404. The low impedance of the switch may provide isolation for the receive impedance. When sized correctly, the switch may provide adequate isolation and have a low potential voltage across its terminals. Circulating currents may be present in the transformer, and the switch device may be sized to pass these currents without distortion.

In receive mode, the power amplifier 401 may be turned off, and presents a known impedance to the matching network 403. Depending on the design of the power amplifier 401, this might be an open circuit, short circuit, or reactive impedance. Switch 406 may be turned off and the load impedance 404 may be coupled to the receive impedance 407 through the transformer 405 and output matching network 403. The output impedance of the power amplifier may effect the connection of the receive port to the output load. Because the isolation between the output load and the power amplifier is usually not a concern, the impedance matching network may be designed to accommodate the off-state power amplifier impedance. An optimum design may be created that provides a good match with low loss between the output and receive ports 409, 410. Other matching elements might also be used at the receive port to improve the receive match, loss, and bandwidth.

Figure 5:
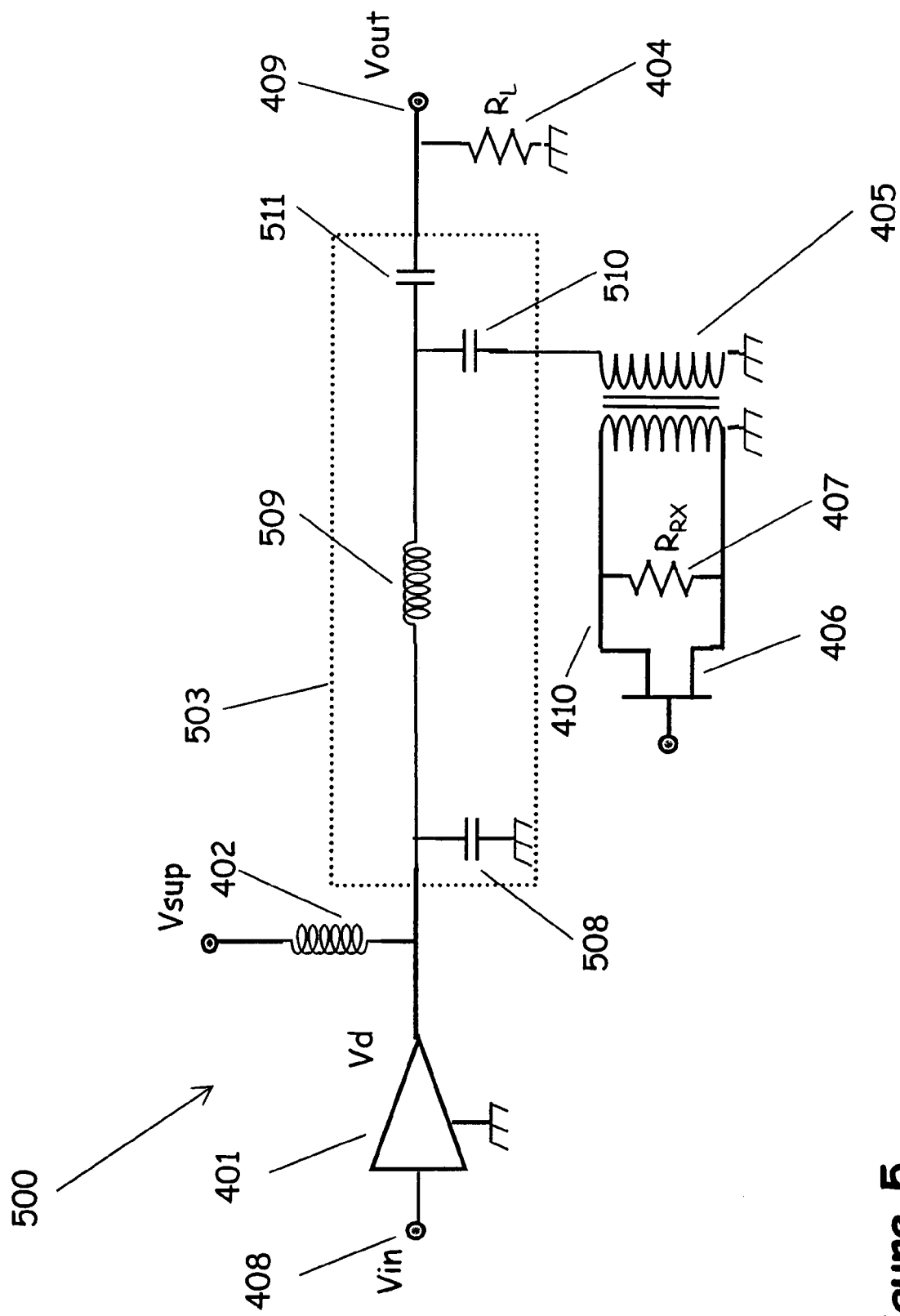
FIG. 5 shows the circuit of FIG. 4 with a first example of an output matching network (OMN)

FIG. 5 shows a more detailed embodiment of the switching system of FIG. 4. In particular, an exemplary implementation of the impedance matching network 403 of FIG. 4 is shown. Impedance matching network 503 comprises a first shunt capacitor 508, a series inductor 509, a second shunt capacitor 510, and a series blocking capacitor 511. The shunt capacitor 510 is coupled to the secondary winding of the transformer 505. When the switch is turned on, the capacitor 510 is effectively coupled to ground and the power amplifier 401 is able to operate with the proper impedance. The receive port 410 may be isolated by the low impedance of the switch and only low signal potentials may be present at the switch terminals. In receive mode, the power amplifier 401 may be turned off and present an impedance characterized by a high real part in parallel with a shunt capacitance. The output capacitance of the device combined with the shunt capacitor 508 may resonate with the bias inductor 402. The value of the inductor 402 may be chosen so that the reactances cancel and a high impedance is presented at the series inductor 509. The receive port 410 may then be coupled directly through the transformer 405, the shunt capacitance 510 and the blocking capacitor 511. The leakage inductance of the transformer may be designed to cancel the series reactance of the capacitor 510, leaving a low impedance path between the receive port and the output load.

Figure 6:
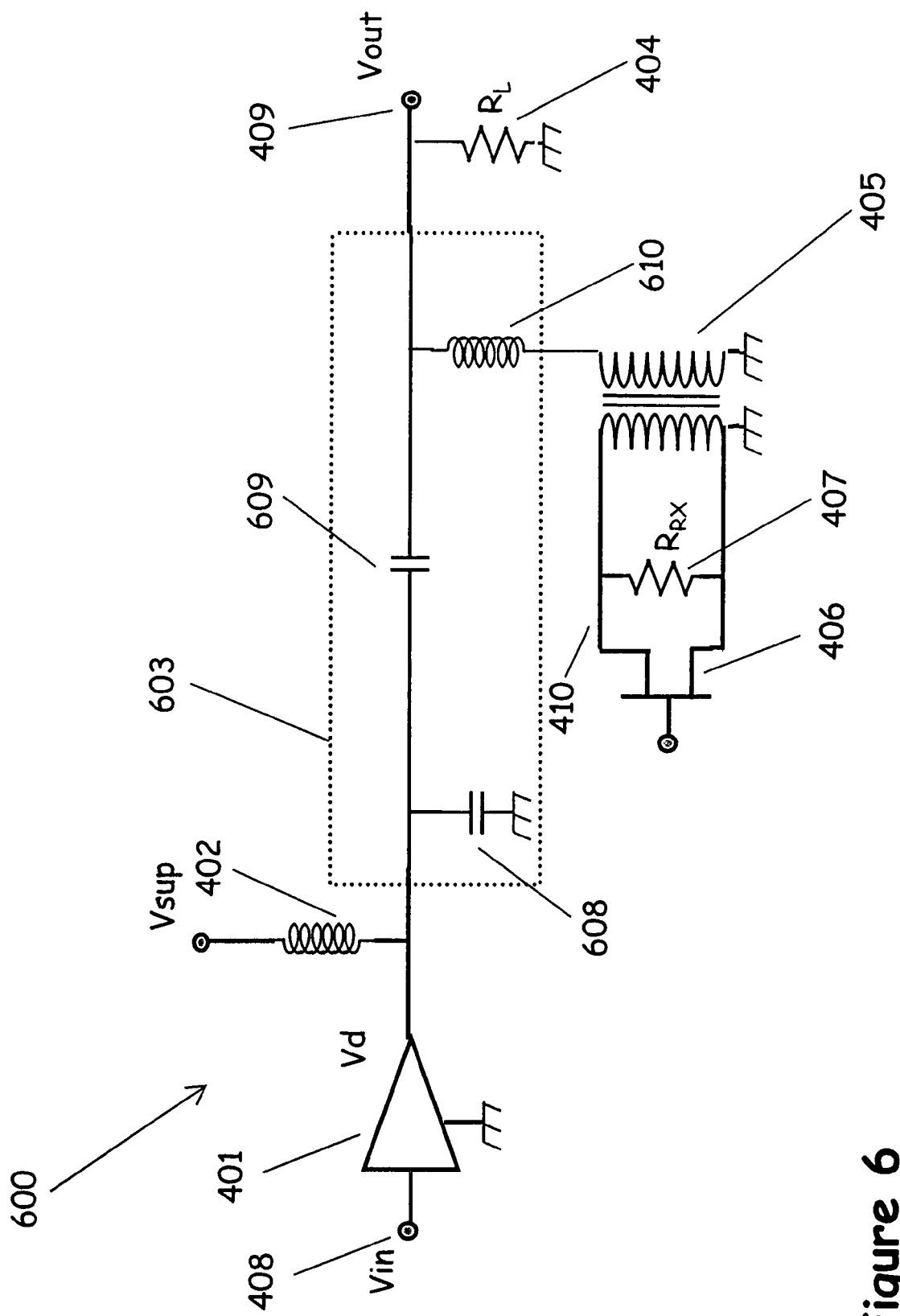
FIG. 6 shows the circuit of FIG. 4 with a second example of an OMN.

FIG. 6 shows the switching system of FIG. 4 with another exemplary implementation of the impedance matching network 403 of FIG. 4. In this embodiment, the impedance matching network 603 comprises a shunt capacitor 608, a series capacitor 609, and a shunt capacitor 610. The operation in transmit mode is similar to the circuit in FIG. 5, with the receive network coupling the inductor 610 to ground for proper matching. In receive mode, the power amplifier may be put into a low impedance state. This may happen in some power amplifier circuits. A secondary matching network, for example, might transform the naturally high state of the amplifier devices to a low impedance at the output. In this state, capacitor 608 and inductor 602 are effectively removed from the circuit, and one side of the series capacitor 609 sees a short. Capacitor 609 then serves as a shunt capacitance in parallel with the inductor 610, the leakage inductance of the transformer and the receive load. This capacitance may be used to tune the receive branch for optimum performance.

Figure 7:
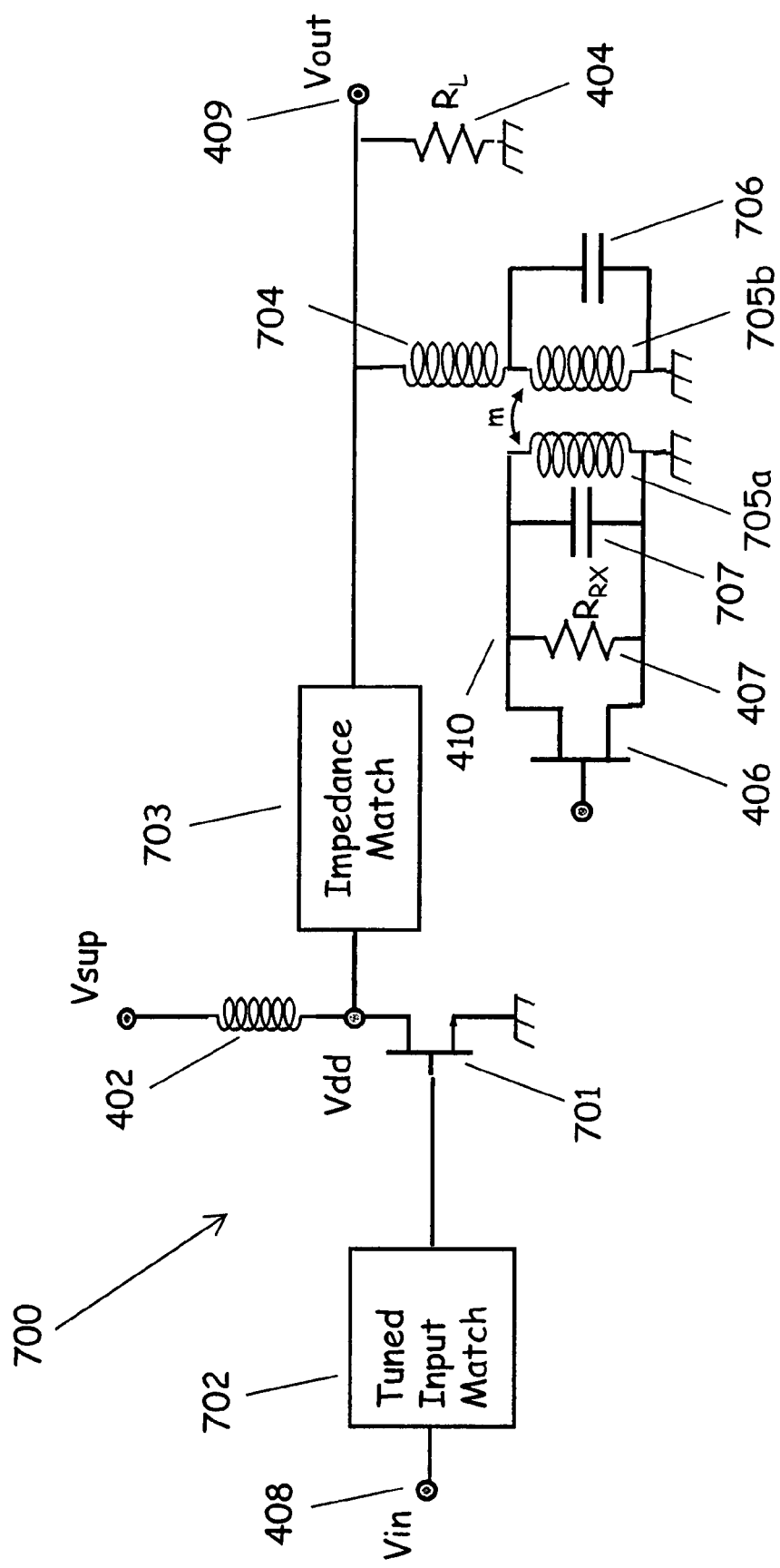
FIG. 7 shows another embodiment of a switching system.

FIG. 7 shows another exemplary embodiment of a switching system. In the switching system 700, the matching network 703 may represent either the low-pass network of FIG. 5 or the high-pass network of FIG. 6. Shunt matching inductor 704 has been left out of the matching block to illustrate the operation of the switch. As shown, the transformer has been realized using coupled inductors 705a and 705b. These may be characterized by a self inductance for each coil and a mutual inductance. Those familiar in the art will be able to translate this real structure with a transformer network characterized by a number of turns and a leakage inductance. The coupled coils may be realized by parallel windings around a core, spiral inductors printed on a board or substrate, or coupled transmission lines. The capacitors 706 and 707 may be used to resonate with the leakage inductance and improve the loss of the transformer. Receive impedance 407 and switch device 406 may operate in a manner similar to the corresponding devices in the circuit in FIG. 6.

Figure 8:
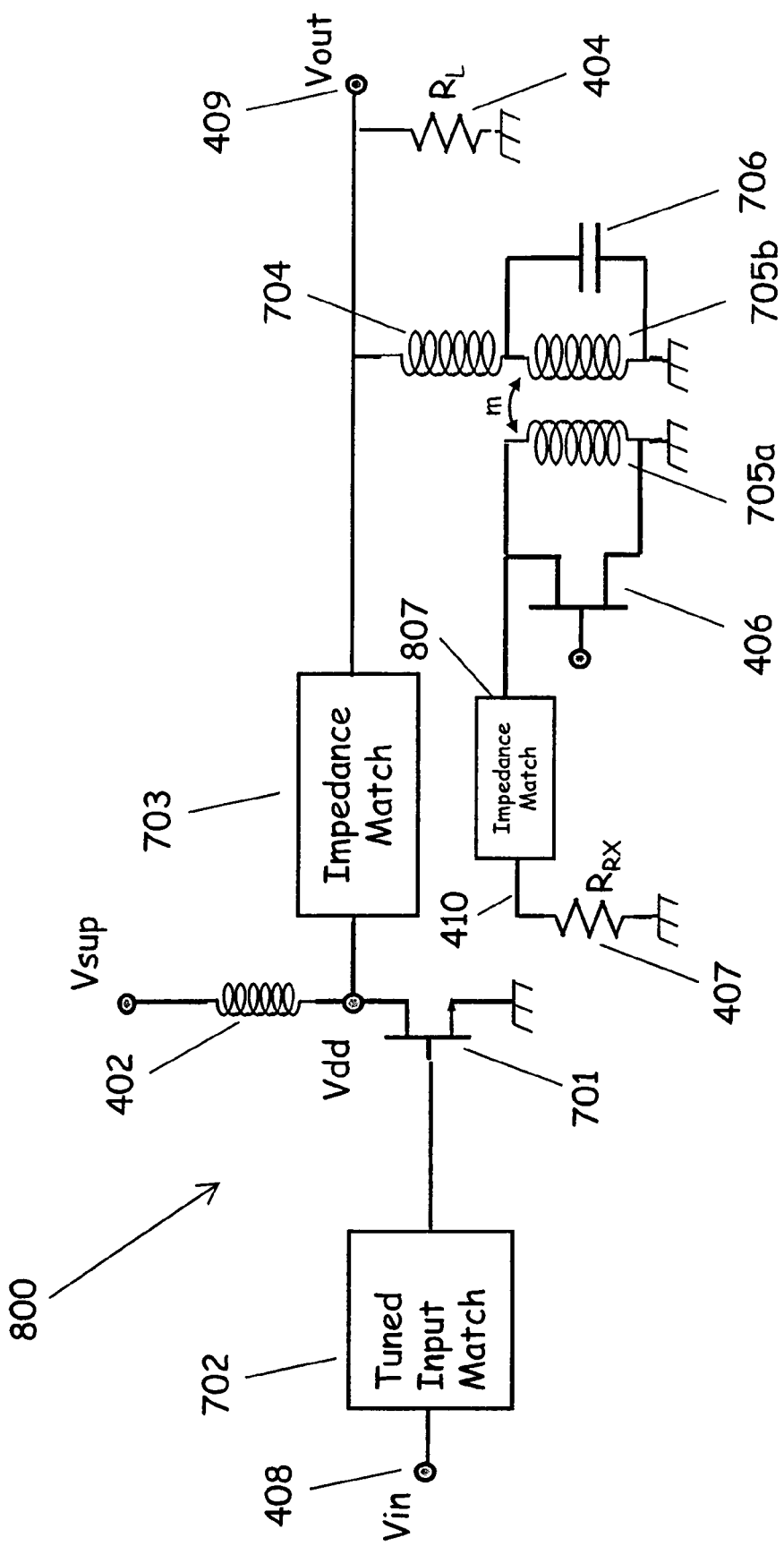
FIG. 8 shows a variation on the circuit of FIG. 7.

FIG. 8 shows a switching system 800 that is similar to the switching system 700 of FIG. 7, but replaces the capacitor 707 with a more complex and arbitrary impedance matching network 807. This provides more flexibility to resonate with the leakage inductance, and at the same time provide a proper match to the load impedance $R_{RX}$, 407. Impedance matching network 807 may be comprised of shunt and series capacitors and inductors.

Figure 9:
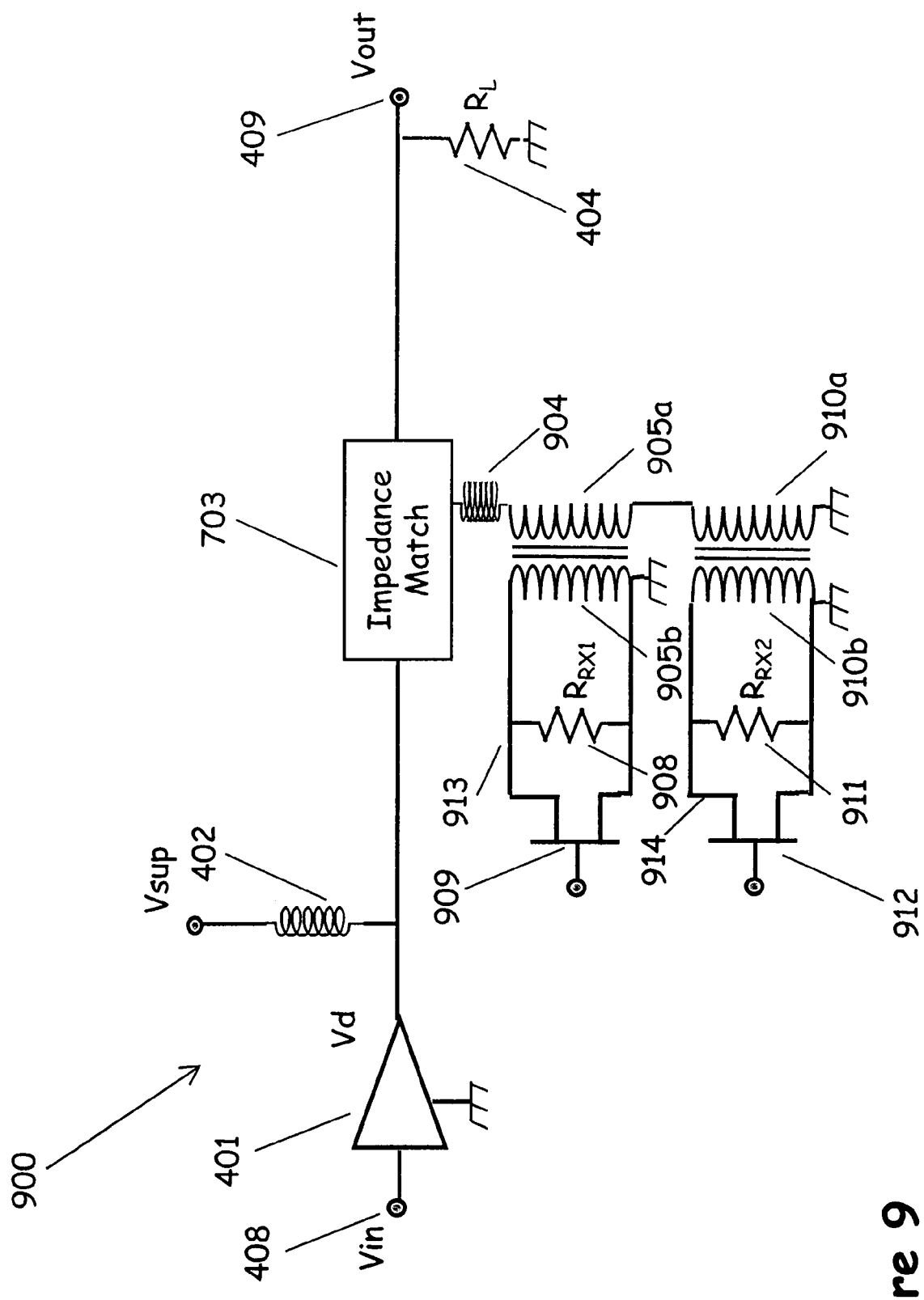
FIG. 9 shows an embodiment of a switching system usable for multi-port operation.

The circuit of FIG. 9 shows an embodiment that provides for two receive ports. This effectively creates a Single-Throw-Triple-Pull (SP3T) switch. Similar to other switching systems described herein, the switching system 900 comprises a power amplifier 401 coupled between a transmit port 408 and a bias inductor 402. The bias inductor 402 is coupled to an impedance matching network 703, which is in turn coupled to an output load 404 at an output port 409. The impedance matching network 703 is coupled via an inductor 904 to first and second transformers 905, 910 (or first and second coupled inductor pairs 905a,b and 910b,c) corresponding to first and second receive ports 913, 914. Inductor 905b is coupled in parallel with receive load 908 and switch device 909, while inductor 910b is coupled in parallel with a second receive load 911 and switch device 912. During transmit, both switches 909, 912 are on and the inductors 905b and 910b are effectively short circuited. During receive mode, one of the switches may remain closed to maintain the associated inductor as an effective short circuit, while the other switch is open. This provides selectivity between two or more ports while keeping the same advantages during the transmit mode. This technique may be extended to an arbitrary number of receive ports with the penalty of additional leakage inductance and loss due to the circulating currents. Other techniques and embodiments will be apparent to those skilled in the art.

Figure 10:
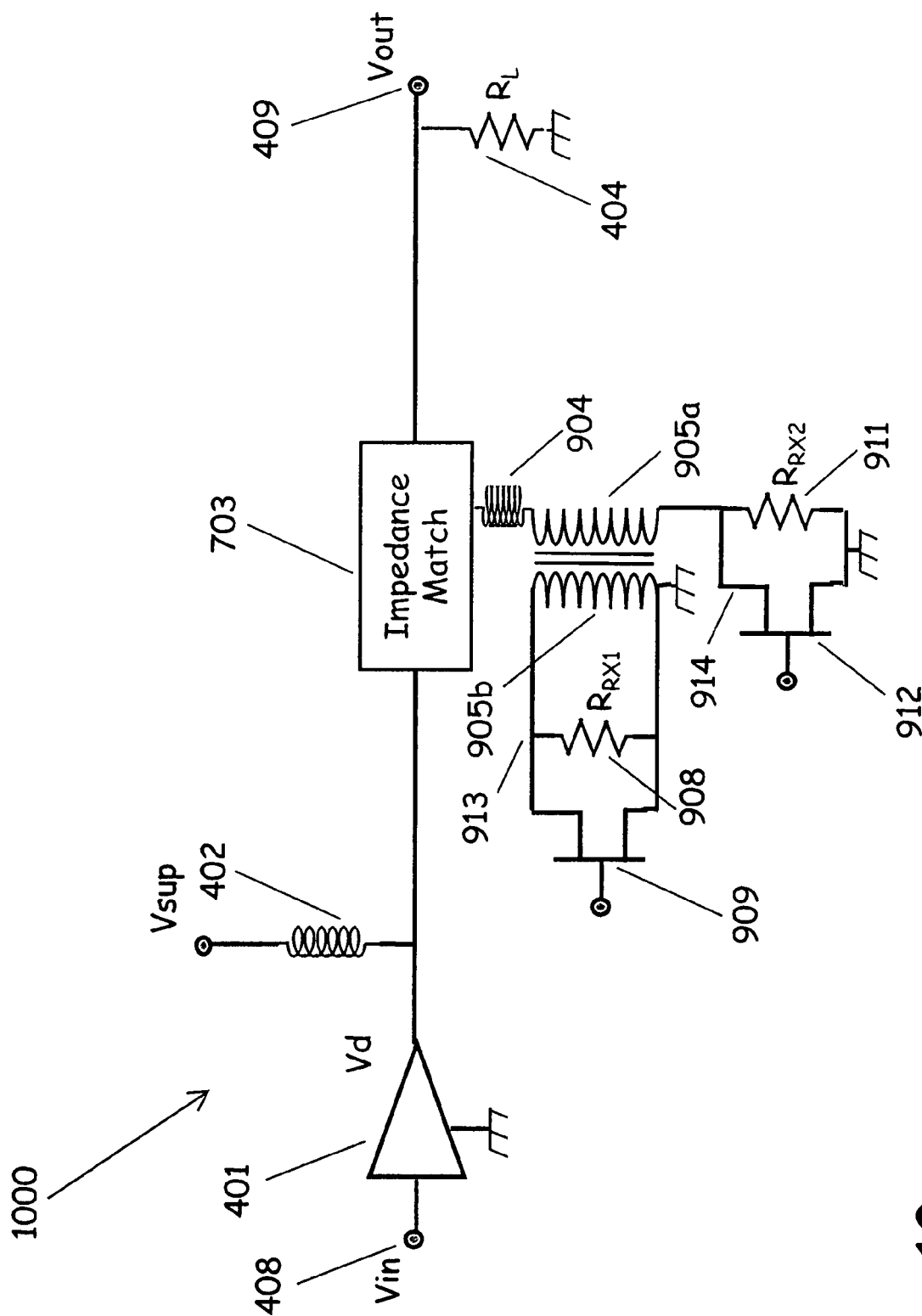
FIG. 10 shows an another embodiment of a switching system usable for multi-port operation.

FIG. 10 shows an alternate embodiment of the multi-port switch of FIG. 9. In particular, switching system 1000 omits transformer 910 (or coupled inductors 910a, 910b), such that switch 1011 is in the ground path for transformer 905 (or coupled inductors 905a, 905b). In this case, the switch 1011 may be used to provide a real short circuit to one end of inductor 905a, rather than the virtual short circuit provided by the transformer 910 (or coupled inductors 910a, 910b) of FIG. 9. Those skilled in the art will recognize that a variety of matching elements may be added to improve performance.

Figure 11:
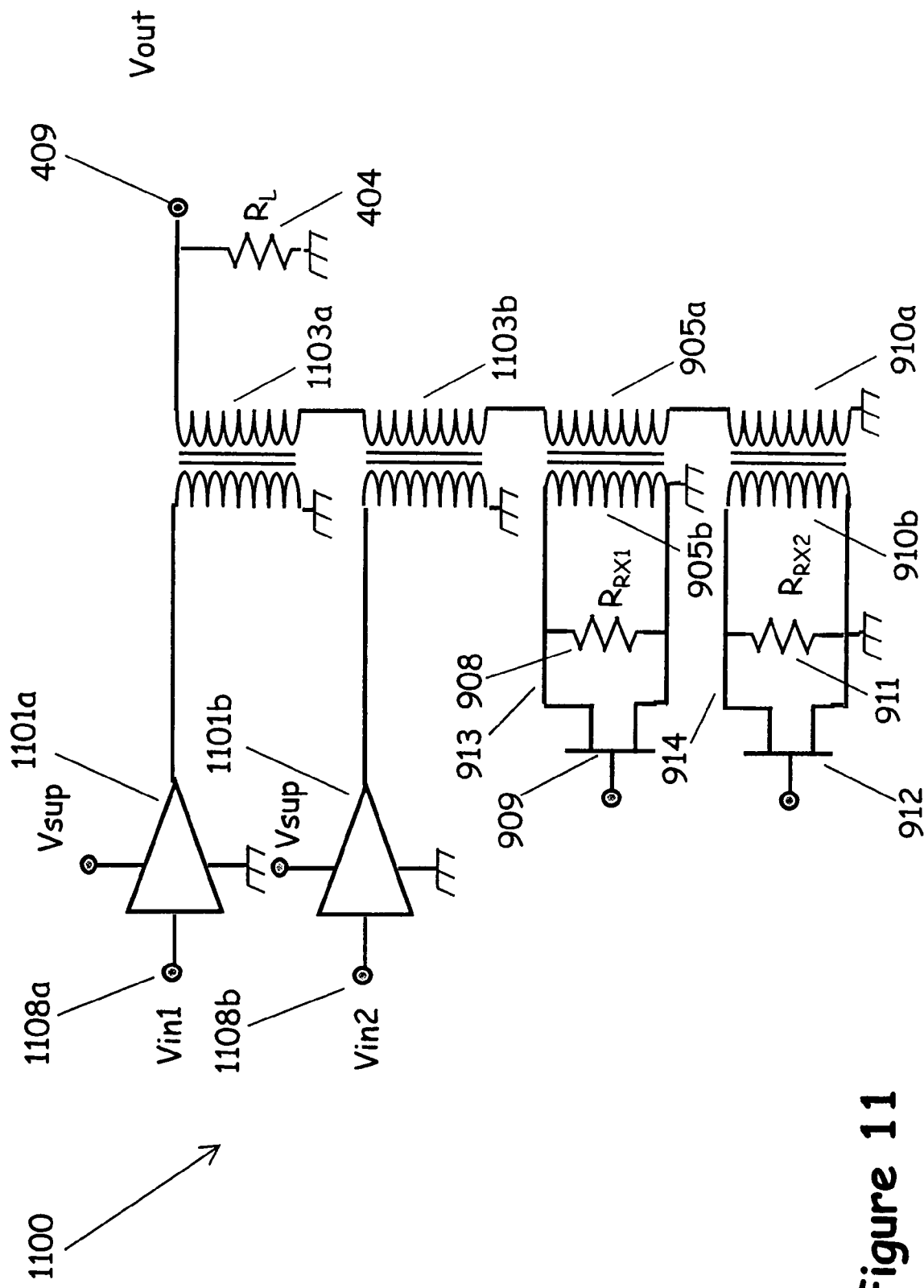
FIG. 11 shows a further embodiment of a switching system usable for multi-port operation.

FIG. 11 shows a variation on the switching system of FIG. 9 wherein the amplifier 901 and matching network 903 have been realized using a pair of amplifiers 901a, 901b matched using coupled inductors or transformers 1103a, 1103b. Amplifiers 901a and 901b are associated with respective first and second transmit ports 908a and 908b. Amplifier pair 901a and 901b may be configured differentially or in phase, and be of equal or substantially different sizes. More than two amplifiers may also be combined in this manner. Coupled inductors, or transformers, 1103a and 1103b may also be constructed in a similar manner to the coupled inductors or transformers of 1105 and 1110. A transformer implementation of 1103a and 1103b may use a turns ratio of 1: 1, as drawn, or virtually any other turns ratio.

Figure 12:
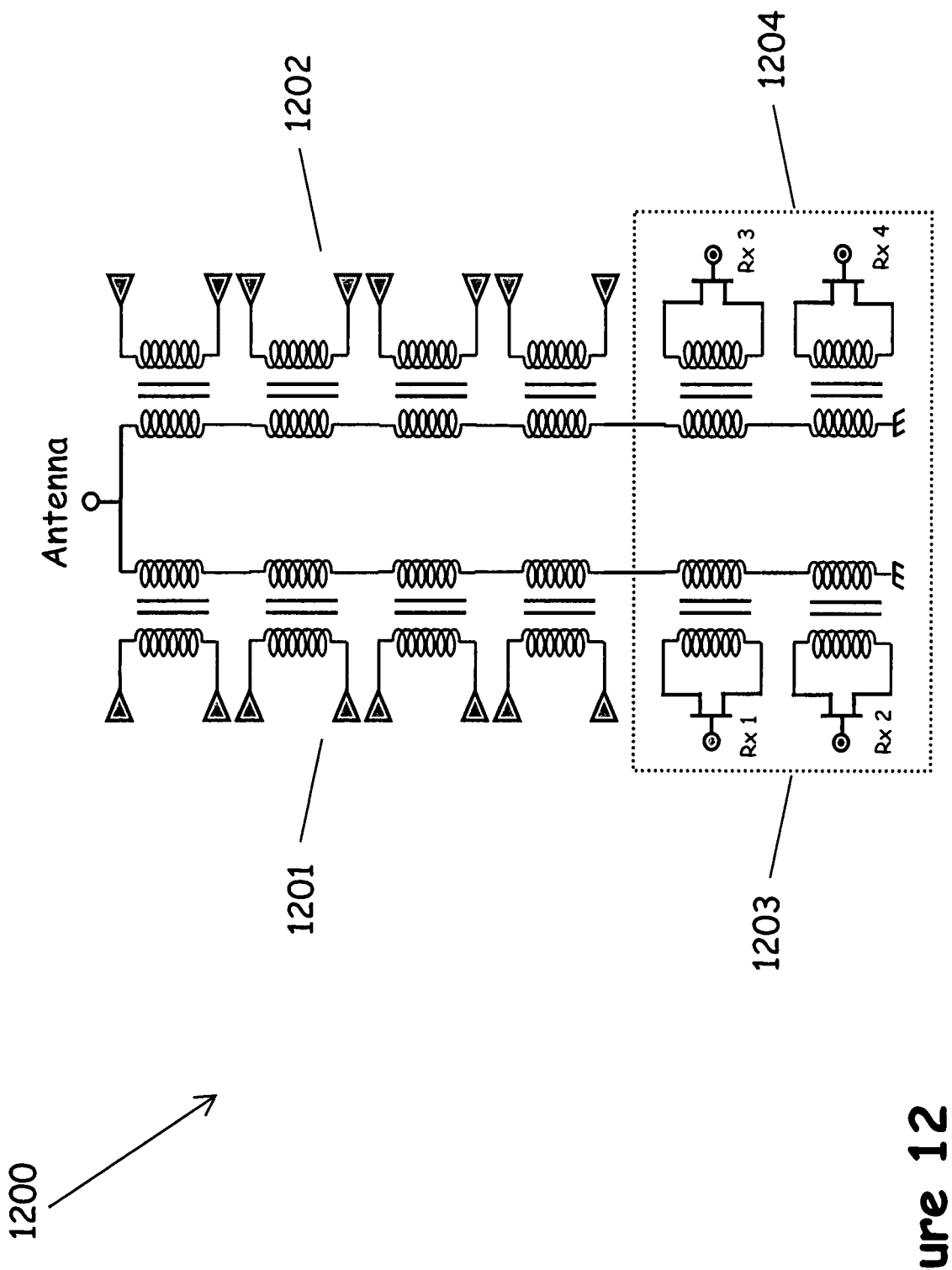
FIG. 12 shows yet another embodiment of a switching system usable for multi-band, multi-port operation.

FIG. 12 shows an exemplary embodiment of the invention wherein the amplifier is made up of many small components, each combined via a coupled inductor transformer network. For example, amplifiers 1201 and 1202 may represent separate amplifiers covering different frequency ranges. Receive switch sections 1203 and 1204 function in a similar manner to the circuit of FIG. 9, in this case allowing for selection between four receivers Rx 1, Rx 2, Rx 3, Rx 4. In this embodiment, switch sections 1203 and 1204 may be designed to work with separate amplifiers and cover different frequency ranges. Additional transmit or receive paths can be added as desired according to any of the previously described embodiments. In addition, any number of the receive switches can be fabricated using complementary metal oxide semiconductor (CMOS) technology. More variations on this theme will be evident to one skilled in the art.

The circuits of the switching systems described herein may be implemented using, for example, silicon bipolar transistors, CMOS transistors, Gallium arsenide (GaAs), metal semiconductor field effect transistors (MESFETs), GaAs heterojunction bipolar transistors (HBTs), and/or GaAs pseudomorphic high electron mobility transistors (PHEMTs). The circuits may also be compatible with the various integrated circuit (IC) technologies associated with the above technologies, and can yield a monolithic solution.

One exemplary application of the switching systems described herein is a transmit/receive switch. In the methods and systems described herein, the switch may generate no harmonics larger than approximately −60 dB (or −70 dB, according to another example) relative to the transmission carrier signal when the switching system is operated in a transmit mode. In addition, in the methods and systems described herein, the switch may impose a signal loss on the transmission signal that is no greater than approximately 2.5 dB (or 1.5 dB, according to another example). Thus, the transmit/receive switch may advantageously operate with reduced loss and distortion. It should be appreciated that while a transmit/receive switch is one beneficial application of the switching systems described herein, the invention is not so limited.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A switching system operable in a transmit mode and a receive mode, the switching system comprising:
    a transmit port coupled via a transmit path to an input/output port;
    a receive port coupled via a receive path to the input/output port; and
    a switching circuit in the receive path, the switching circuit comprising a switch device comprising an input terminal, an output terminal, and a control terminal to receive a control signal that controls a state of the switch device between an on state and an off state;
    wherein, when the switch device is in the on state, the switching system is adapted to operate in a transmit mode in which the transmit port is operatively coupled to the input/output port and the receive port is at least substantially isolated from the input/output port; and
    wherein, when the switch device is in the off state, the switching system is adapted to operate in a receive mode in which the receive port is operatively coupled to the input/output port.

2. The switching system of claim 1, wherein the switch device comprises a transistor.

3. The switching system of claim 1, wherein the switching system is implemented in CMOS.

4. The switching system of claim 1, wherein, in the receive mode, the transmit path is not isolated from the input/output port.

5. The switching system of claim 4, further comprising a power amplifier in the transmit path, wherein the power amplifier has a predetermined impedance when the switching system is in the receive mode.

6. The switching system of claim 5, wherein the impedance of the power amplifier is substantially zero when the switching system is the receive mode.

7. The switching system of claim 5, wherein the impedance of the power amplifier is that of an open circuit when the switching system is the receive mode.

8. The switching system of claim 1, wherein the switching system comprises at least one transistor, and wherein each transistor of the switching system is adapted to be in an on state when the switching system is in the transmit mode.

9. The switching system of claim 1, further comprising:
    a second receive port coupled via a second receive path to the input/output port; and
    a second switching circuit in the second receive path, the second switching circuit comprising a second switch device comprising an input terminal, an output terminal, and a control terminal to receive a second control signal that controls a state of the second switch device between an on state and an off state;
    wherein, when the second switch device is in the off state, the switching system is adapted to operate in a second receive mode in which the second receive port is operatively coupled to the input/output port.

10. The switching system of claim 1, wherein the switching circuit is adapted to create an at least substantially short circuit between the receive port and ground.

11. The switching system of claim 1, wherein the switching element further comprises an inductor in parallel with the switch device.

12. The switching system of claim 11, wherein the switch device is adapted to substantially short circuit the inductor when the switch device is in the on state.

13. The switching system of claim 1, wherein the switching element further comprises a transformer in parallel with the switch device.

14. The switching system of claim 1, wherein transmit port and the receive port are coupled to the input/output port via an impedance matching network.

15. The switching system of claim 14, wherein in the transmit mode, the switching circuit is adapted to create a virtual ground at a node between the impedance matching network and the receive port.

16. The switching system of claim 1, further comprising means for at least substantially isolating the receive port from the input/output port in the transmit mode.

17. The switching system of claim 1, wherein the input/output port comprises an antenna.

18. The switching system of claim 1, further comprising a power amplifier in the transmit path.

19. The switching system of claim 18, wherein the power amplifier is implemented in CMOS.

20. The switching system of claim 1, wherein the switching circuit is adapted to generate no harmonics larger than approximately −60 dBC when the switching system is operated in the transmit mode, and wherein the switching circuit is adapted to impose a signal loss on a transmitted signal that is no greater than about 2.5 dB when the switching system is operated in the transmit mode.

21. A CMOS-implemented switching system comprising:
    one or more transmit ports, each coupled via a respective transmit path to an input/output port; and
    one or more receive ports, each coupled via a respective receive path to the input/output port;
    wherein each receive path comprises a switching circuit comprising a transistor and an inductor in parallel with the transistor, wherein the switching circuit is adapted to at least substantially isolate the respective receive port from the input/output port when the transistor is in an on state and operatively couple the respective receive port to the input/output port when the transistor is an off state.

22. The CMOS-implemented switching system of claim 21, wherein the one or more receive paths comprises first and second receive paths.

23. The CMOS-implemented switching system of claim 21, wherein the first and second receive paths respectively comprise first and second switching circuits respectively comprising first and second transistors, and wherein the first and second switching circuits are constructed and arranged such that each of the first and second transistors are in an on state during a transmit mode of the switching system.

24. Transmit/receive device comprising:
an antenna;
a radio-frequency transmitter;
a radio-frequency receiver; and
a switching system comprising:
- a transmit port arranged between the transmitter and the antenna, wherein the transmit port is coupled to the antenna via a transmit path;
- a receive port arranged between the receiver and the antenna, wherein the receive port is coupled to the antenna via a receive path; and
- a switching circuit in the receive path, the switching circuit comprising a switch device comprising an input terminal, an output terminal, and a control terminal to receive a control signal that controls a state of the switch device between an on state and an off state;
- wherein, when the switch device is in the on state, the switching system is adapted to operate in a transmit mode in which the transmit port is operatively coupled to the input/output port and the receive port is at least substantially isolated from the input/output port; and
- wherein, when the switch device is in the off state, the switching system is adapted to operate in a receive mode in which the receive port is operatively coupled to the input/output port.

25. The transmit/receive device of claim 24, further comprising a power amplifier in the transmit path.

26. The transmit/receive device of claim 24, wherein the switching system is implemented in CMOS.

27. A switching method, comprising an act of:
using CMOS switching circuitry, switching a transmit/receive device between a transmit mode, in which a transmission signal comprising a transmission carrier signal is transmitted from a transmit port to an input/output port, and a receive mode, in which a reception carrier signal is transmitted from the input/output port to a receive port;
wherein, when operated in the transmit mode, the CMOS switching circuitry generates no harmonics larger than approximately −60 dB relative to the transmission carrier signal; and
wherein, when operated in the transmit mode, the CMOS switching circuitry imposes a signal loss on the transmission signal that is no greater than about 2.5 dB.

28. A switching system, comprising:
CMOS switching circuitry adapted to switch between a transmit mode, in which a transmission signal comprising a transmission carrier signal is transmitted from a transmit port to an input/output port, and a receive mode, in which a reception carrier signal is transmitted from the input/output port to a receive port;
wherein the CMOS switching circuitry is adapted to generate no harmonics larger than approximately −60 dB relative to the transmission carrier signal when operated in the transmit mode; and
wherein the CMOS switching circuitry is adapted to impose a signal loss on the transmission signal that is no greater than about 2.5 dB when operated in the transmit mode.

29. The switching system of claim 28, wherein the CMOS switching circuitry is integrated in a non-silicon on insulator (SOI) silicon substrate.

30. The switching system of claim 29, wherein the non-SOI silicon substrate comprises at least a portion of a single-crystal silicon wafer.

31. A switching system operable in a transmit mode and a receive mode, the switching system comprising:
- a plurality of ports comprising at least one transmit port coupled to an input/output port and at least one receive port coupled the input/output port; and
- switching circuitry adapted to select one of the plurality of ports to be operatively coupled the input/output port, wherein a transmit port is operatively coupled to the input/output port when the switching system is operated a transmit mode, and wherein a receive port is coupled to the input/output port when the switching system is operated in a transmit mode;
- wherein the switching circuitry comprises at least one transistor, and wherein each transistor of the switching circuitry is in an on state when the switching system is operated in the transmit mode.

32. The switching system of claim 31, wherein at least one receive path between the at least one receive port and the input/output port comprises the at least one transistor.

33. A switching system operable in a first mode and a second mode, the switching system comprising:
- a first port coupled via a first path to an input/output port, wherein the first port passes a first signal;
- a second port coupled via a second path to the input/output port, wherein the second port passes a second signal having a lower power than the first signal; and
- a switching circuit in the second path, the switching circuit comprising a switch device comprising an input terminal, an output terminal, and a control terminal to second a control signal that controls a state of the switch device;
- wherein the switching circuit is adapted to switch the switching system between (1) a first mode in which the voltage across the switch device is substantially zero, the first port is operatively coupled to the input/output port, and the second port is at least substantially isolated from the input/output port, and (2) a second mode in which the second port is operatively coupled to the input/output port.

34. A switching system comprising:
one or more first ports, each coupled via a respective first path to an input/output port, wherein each first port passes a respective first signal; and
one or more second ports, each coupled via a respective second path to the input/output port, wherein each second port passes a respective second signal having a lower power than each first signal;
wherein each second path comprises a switching circuit comprising a transistor and a transformer in parallel with the transistor;
and wherein the switching circuit is adapted to switch the switching system between (1) a first mode in which the voltage across the transistor is substantially zero, the first port is operatively coupled to the input/output port, and the second port is at least substantially isolated from the input/output port, and (2) a second mode in which the second port is operatively coupled to the input/output port.

35. The switching system of claim 34, wherein the one or more first ports comprises a single port and wherein the one or more second ports comprises a plurality of ports.

36. The switching system of claim 34, wherein the one or more first ports comprises a plurality of ports and wherein the one or more second ports comprises a plurality of ports.

37. The switching system of claim 34, wherein the one or more first ports comprises a single port and wherein the one or more second ports comprises a single port.

38. The switching system of claim 34, wherein the one or more first ports comprises a plurality of ports and wherein the one or more second ports comprises a single port.

* * * * *